United States Patent
Chi

(10) Patent No.: US 12,106,577 B2
(45) Date of Patent: Oct. 1, 2024

(54) METHOD, APPARATUS, AND DEVICE FOR TESTING TRAFFIC FLOW MONITORING SYSTEM

(71) Applicant: Apollo Intelligent Connectivity (Beijing) Technology Co., Ltd., Beijing (CN)

(72) Inventor: Yuan Chi, Beijing (CN)

(73) Assignee: Apollo Intelligent Connectivity (Beijing) Technology Co., Ltd., Beijing (CN)

( * ) Notice: Subject to any disclaimer, the term of this patent is extended or adjusted under 35 U.S.C. 154(b) by 384 days.

(21) Appl. No.: 17/462,065

(22) Filed: Aug. 31, 2021

(65) Prior Publication Data

US 2021/0390321 A1      Dec. 16, 2021

(30) Foreign Application Priority Data

Mar. 5, 2021   (CN) .......................... 202110247184.1

(51) Int. Cl.
| | | |
|---|---|---|
| *G06V 20/58* | (2022.01) | |
| *G06V 20/54* | (2022.01) | |
| *G08G 1/01* | (2006.01) | |
| *G06F 30/20* | (2020.01) | |

(52) U.S. Cl.
CPC .............. *G06V 20/58* (2022.01); *G06V 20/54* (2022.01); *G08G 1/0112* (2013.01); *G08G 1/0116* (2013.01); *G06F 30/20* (2020.01)

(58) Field of Classification Search
CPC ........... G06V 20/58; G08G 1/00; G06F 30/20
See application file for complete search history.

(56) References Cited

U.S. PATENT DOCUMENTS

| | | | |
|---|---|---|---|
| 2007/0030171 A1 | 2/2007 | Cheevarunothai et al. | |
| 2019/0164007 A1 | 5/2019 | Liu et al. | |

FOREIGN PATENT DOCUMENTS

| | | | | |
|---|---|---|---|---|
| CN | 103473925 A | 12/2013 | | |
| CN | 104539487 A | 4/2015 | | |
| CN | 206772594 U | 12/2017 | | |
| CN | 108389399 A | * 8/2018 | ............. | G08G 1/065 |
| CN | 109714421 A | 5/2019 | | |
| CN | 110781578 A | 2/2020 | | |

(Continued)

OTHER PUBLICATIONS

Office Action of corresponding Chinese Application No. 2021102471841, dated Apr. 12, 2022, 7 pages.

(Continued)

*Primary Examiner* — Lam S Nguyen
(74) *Attorney, Agent, or Firm* — Tucker Ellis LLP

(57) ABSTRACT

The present application discloses a method, an apparatus, and a device for testing a traffic flow monitoring system, which relates to intelligent traffic, vehicle-road collaboration, and cloud platform technologies in a field of data processing. The specific implementation is: obtaining real obstacle data collected in a real traffic scene; generating simulated obstacle data according to the real obstacle data, where the simulated obstacle data is used to simulate an obstacle in the real traffic scene and a movement state of the obstacle; and sending the simulated obstacle data to a first traffic flow monitoring system to be tested to test the first traffic flow monitoring system.

15 Claims, 7 Drawing Sheets

(56) References Cited

FOREIGN PATENT DOCUMENTS

| | | |
|---|---|---|
| CN | 110798449 A | 2/2020 |
| CN | 110853393 A | 2/2020 |
| CN | 111857094 A | 10/2020 |
| CN | 112188440 A | 1/2021 |
| EP | 3621052 A1 | 3/2020 |
| JP | 2017168093 A | 9/2017 |
| JP | 2019144985 A | 8/2019 |
| JP | 202074502 A | 5/2020 |
| KR | 20190072437 A | 6/2019 |
| WO | 2019/151427 A1 | 8/2019 |

OTHER PUBLICATIONS

Translation of Office Action of corresponding Chinese Application No. 2021102471841, dated Apr. 12, 2022, 2 pages.
European Search Report dated Feb. 22, 2022 for Application Serial No. 21193479.9 (8 pages).
Office Action of corresponding Japanese Application No. 2021144902, dated Oct. 6, 2022, 10 pages.

\* cited by examiner

METHOD, APPARATUS, AND DEVICE FOR TESTING TRAFFIC FLOW MONITORING SYSTEM

CROSS-REFERENCE TO RELATED APPLICATIONS

The present application claims priority to Chinese application number 2021102471841, filed on Mar. 5, 2021, which is incorporated by reference in its entirety.

TECHNICAL FIELD

The present application relates to intelligent traffic, vehicle-road collaboration, and cloud platform technologies in a field of data processing and, in particular, to a method, an apparatus and a device for testing a traffic flow monitoring system.

BACKGROUND

In an architecture of an intelligent traffic system, an on board device and a roadside device collect obstacle data on a road, and report the obstacle data to a traffic flow monitoring system. The traffic flow monitoring system perceives and processes the obstacle data, so as to realize a monitoring of a traffic flow.

Generally, the traffic flow monitoring system needs to be tested before it goes online. In the prior art, it is necessary to use a mock tool to construct simulated obstacle data, and input the simulated obstacle data into the traffic flow monitoring system to test the traffic flow monitoring system.

SUMMARY

The present disclosure provide a method, an apparatus and a device for testing a traffic flow monitoring system.

In a first aspect, a method for testing a traffic flow monitoring system is provided, including:

obtaining real obstacle data collected in a real traffic scene;

generating simulated obstacle data according to the real obstacle data, where the simulated obstacle data is used to simulate an obstacle in the real traffic scene and a movement state of the obstacle; and sending the simulated obstacle data to a first traffic flow monitoring system to be tested to test the first traffic flow monitoring system.

In a second aspect, an electronic device is provided, including: at least one processor; and a memory communicatively connected to the at least one processor; where the memory is stored with instructions executable by the at least one processor, and the instructions are executed by the at least one processor to enable the at least one processor to execute the method described in any one of the first aspect.

In a third aspect, a non-transitory computer readable storage medium stored with computer instructions is provided, where the computer instructions are configured to enable a computer to execute the method described in any one of the first aspect.

It should be understood that the content described in this section is not intended to point out the key or important features of embodiments of the present application, nor to limit the scope of the present application. Other features of the present application will be easily understood through the following description.

BRIEF DESCRIPTION OF DRAWINGS

The drawings are used for better understanding of the present scheme and do not constitute a limitation of the present application. Among them.

DESCRIPTION OF EMBODIMENTS

The following describes exemplary embodiments of the present application with reference to the accompanying drawings, which includes various details of the embodiments of the present application to facilitate understanding, and the described embodiments are merely exemplary. Therefore, persons of ordinary skill in the art should know that various changes and modifications can be made to the embodiments described herein without departing from the scope and spirit of the embodiments of the present application. Also, for clarity and conciseness, descriptions of well-known functions and structures are omitted in the following description.

The present application provides a method, an apparatus and a device for test a traffic flow monitoring system, which are applied to intelligent traffic, vehicle-road collaboration, and cloud platform technologies in a field of data processing, to improve an accuracy of a test result for the traffic flow monitoring system.

A vehicle-road collaboration system is a development direction of the Intelligent Traffic System (ITS). By adopting advanced wireless communication and new-generation Internet technologies and implementing dynamic and real-time information interaction between vehicles, vehicles and roads in an all-round way, and performing active vehicle safety control and road collaborative management on the basis of full-time and spatial dynamic traffic information collection and fusion, so that an effective coordination of people, vehicles and roads is fully realized, traffic safety is ensured, and traffic efficiency is improved, thereby the formed vehicle-road collaboration system is a safe, efficient and environmentally friendly road traffic system.

Figure 1:
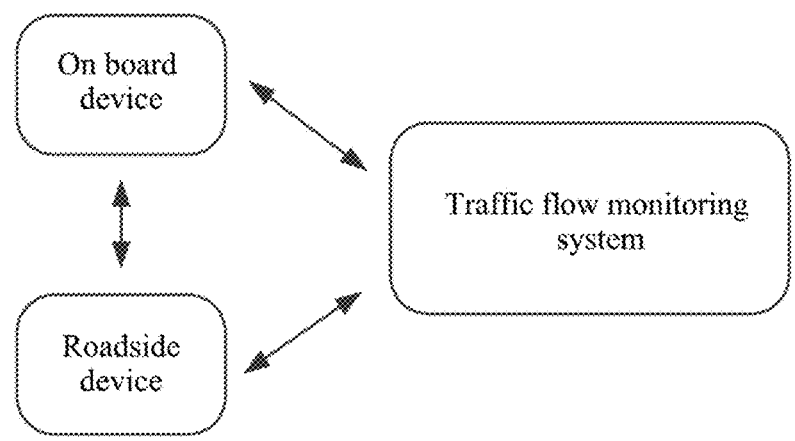
FIG. 1 is a schematic diagram of a traffic flow monitoring scene provided by an embodiment of the present application.

The vehicle-road coordination system may be used to monitor traffic flow. FIG. 1 is a schematic diagram of a traffic flow monitoring scene provided by an embodiment of the present application. As shown in FIG. 1, the application scene includes: an on board device, a roadside device, and a traffic flow monitoring system. The traffic flow monitoring system may be a server located in a cloud, a cloud platform, a vehicle-road system management platform, a central subsystem, etc.

As shown in FIG. 1, the on board device may be connected to the roadside device, the roadside device may be connected to the traffic flow monitoring system, and the on board device may also be directly connected to the traffic flow monitoring system. The roadside device may include a roadside sensing device and a roadside computing device, where the roadside sensing device is connected to the roadside computing device, and the roadside computing device is connected to the traffic flow monitoring system. In another system architecture, the roadside sensing device itself includes computing functions, and the roadside sensing device may be directly connected to the traffic flow monitoring system. The above connection may be wired or wireless.

In some examples, the on board device may include an on board terminal, on board units (OBU), and so on. The roadside device may include a camera, a webcam, a road side unit (RSU), a roadside computing unit, and so on. The on board device and roadside device may collect an obstacle in the current traffic scene to obtain obstacle data. Among them, the obstacles include but is not limited to: a pedestrian, a vehicle, a bicycle, a motorcycle, and so on in the traffic scene. The on board device and the roadside device report the collected obstacle data to the traffic flow monitoring system. The traffic flow monitoring system determines the state of the traffic flow by comprehensively perceiving and analyzing the obstacle data reported by the on board device and/or roadside device.

Usually, the traffic flow monitoring system needs to be tested before it goes online, and it may be tested offline. Since an offline traffic flow monitoring system does not have real data sources (that is, it is cannot to obtain obstacle data collected by the on-board device and the roadside device), therefore, some implementations need to use a mock tool to construct simulated obstacle data and input the simulated obstacle data into the traffic flow monitoring system to test the traffic flow monitoring system.

However, the simulated obstacle constructed by the mock tool is a static obstacle, which cannot simulate the movement characteristic of an obstacle in a real traffic scene, so that the accuracy of the test result for the traffic flow monitoring system cannot be guaranteed.

In other implementations, in the case of using the mock tool to construct the static obstacle, a dynamic obstacle can be constructed by adding random movement to the static obstacle. However, although the obstacle constructed in this way is in a movement state, the movement of the obstacle is random, and it is difficult to form a driving trajectory of an obstacle in a real traffic scene. That is to say, the obstacle constructed in this way still cannot simulate the movement characteristic of the obstacle in the real traffic scene, and thus the accuracy of the test result for the traffic flow monitoring system cannot be guaranteed.

In order to solve at least one of the above technical problems, an embodiment of the present application provides a method for testing a traffic flow monitoring system. The following describes the test scene of the traffic flow monitoring system in an embodiment of the present application with reference to FIG. 2.

Figure 2:
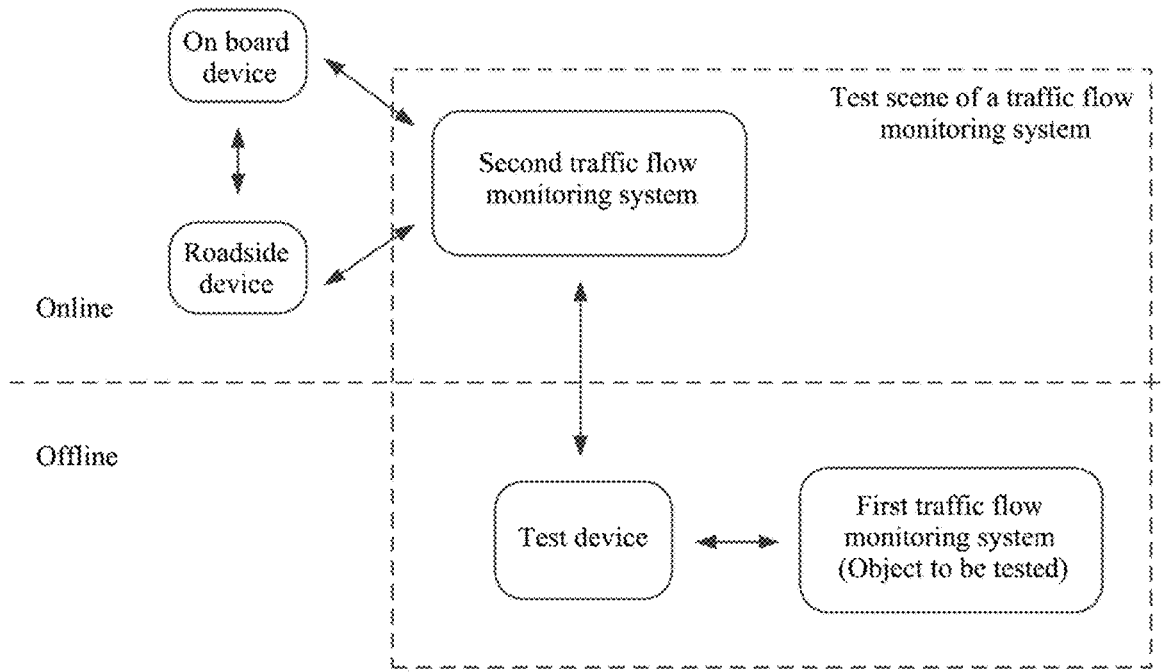
FIG. 2 is a schematic diagram of a test scene of a traffic flow monitoring system provided by an embodiment of the present application.

FIG. 2 is a schematic diagram of a test scene of a traffic flow monitoring system provided by an embodiment of the present application. As shown in FIG. 2, the test scene includes a first traffic flow monitoring system and a test device. The first traffic flow monitoring system is an object to be tested, and the test device is used to test the first traffic flow monitoring system. The test device may send simulated obstacle data to the first traffic flow monitoring system. In an implementation, the test device may also obtain a monitoring result from the first traffic flow monitoring system, so as to determine a test result according to the monitoring result. The test device may be any electronic device with data processing and data sending/receiving function, including but not limited to a desktop computer, a notebook computer, a tablet computer, a personal computer, etc.

In the technical solution provided by the present application, the test device may obtain real obstacle data collected in a real traffic scene, and generate simulated obstacle data according to the real obstacle data, where the simulated obstacle data is used to simulate an obstacle in the real traffic scene and a movement state thereof, and then send the simulated obstacle data to the first traffic flow monitoring system to test the first traffic flow monitoring system.

In some possible implementations, as shown in FIG. 2, the test scene may also include a second traffic flow monitoring system. The second traffic flow monitoring system may be an online traffic flow monitoring system. The second traffic flow monitoring system may obtain the real obstacle data from an on board device, a roadside device, etc. In this way, the test device can establish a communication connection with the second traffic flow monitoring system, and obtain the real obstacle data from the second traffic flow monitoring system.

In the technical solution of the present application, since the simulated obstacle data is generated according to the real obstacle data collected in the real traffic scene, and the simulated obstacle data simulates the obstacle in the real traffic scene and the movement state thereof, therefore, using the simulated obstacle data to test the first traffic flow monitoring system can ensure the authenticity of the obstacle and the movement state thereof input into the first traffic flow monitoring system, thereby ensuring the accuracy of the test result for the first traffic flow monitoring system.

The technical solution of the present application will be described in detail below in combination with several specific embodiments. The following embodiments may be combined with each other, and descriptions for the same or similar content may not be repeated in some embodiments.

Figure 3:
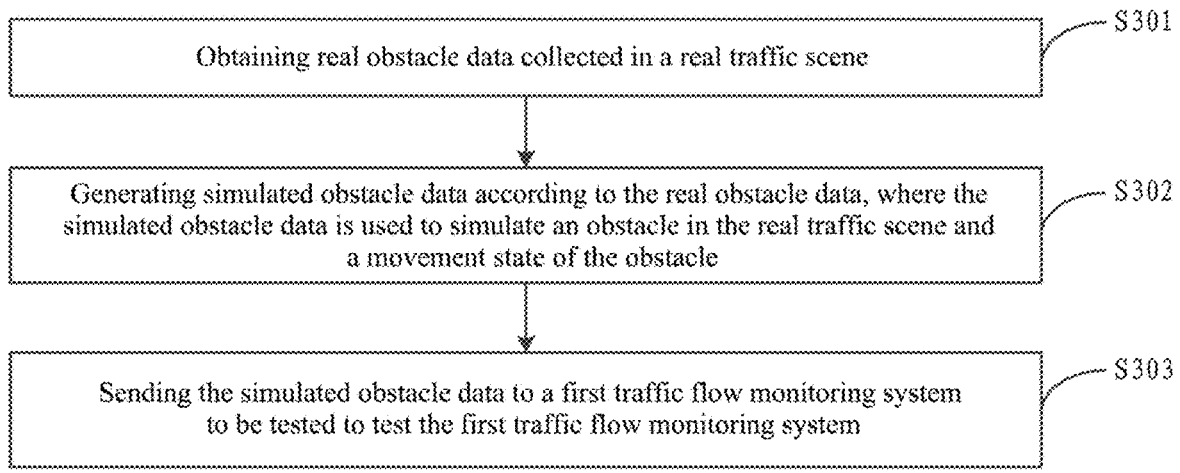
FIG. 3 is a schematic flowchart of a method for testing a traffic flow monitoring system provided by an embodiment of the present application.

FIG. 3 is a schematic flowchart of a method for testing a traffic flow monitoring system provided by an embodiment of the present application. The method of this embodiment may be used to test the first traffic flow monitoring system, that is, the object to be tested in the method of this embodiment is the first traffic flow monitoring system. As shown in FIG. 3, the method of the present embodiment includes:

S301: obtaining real obstacle data collected in a real traffic scene.

The executive body of this embodiment may be the test device in FIG. 2. The test device is in communication connection with the first traffic flow monitoring system for testing the first traffic flow monitoring system.

Among them, the real obstacle data includes data related to each obstacle in the real traffic scene. The obstacle in the embodiment of the present application may be a traffic participant, such as a vehicle, a pedestrian, a bicycle, a motorcycle, and so on. The real obstacle data may be collected by the on board device and/or the roadside device in the real traffic scene. The form of the real obstacle data can include but is not limited to image data, video data, radar data, infrared data, point cloud data, etc., and can also be result data obtained by calculating and analyzing one or more of the above data.

In an implementation, the real obstacle data may be obtained from the online second traffic flow monitoring system. Exemplarily, the test device establishes a communication connection with the second traffic flow monitoring system, and the test device may monitor the real obstacle data input to the second traffic flow monitoring system to obtain the real obstacle data.

In an implementation, the real obstacle data may also be obtained from a database. Exemplarily, the database is used to store historical obstacle data collected by an on board device and/or a roadside device in each road section/area. The test device may obtain the historical obstacle data from the database according to a test requirement. These historical obstacle data are the real obstacle data.

In a possible implementation, the test device determines a traffic flow type of a scene to be tested corresponding to the first traffic flow monitoring system according to an actual test requirement. The traffic flow type may be any one of the following: a large flow scene, a medium flow scene, a low flow scene, a morning peak scene, an evening peak scene, a congested scene, an unblocked scenes, etc. After the traffic flow type of the scene to be tested is determined, the real obstacle data collected in the first real traffic scene is obtained, and the traffic flow type of the first real traffic scene is consistent with the traffic flow type of the scene to be tested.

In this implementation, by selecting the real obstacle data corresponding to the real traffic scene that is consistent with the traffic flow type of the scene to be tested, it can meet the requirements of multiple test scenes and ensure the accuracy of the test results for different test scenes.

S302: generating simulated obstacle data according to the real obstacle data, where the simulated obstacle data is used to simulate an obstacle in the real traffic scene and a movement state of the obstacle.

In this embodiment, the simulated obstacle data may be obtained by modifying the real obstacle data. When the real obstacle data is modified, the related information about the obstacle in the real obstacle data and the movement state thereof can be retained, so that the generated simulated obstacle data can simulate the obstacle in the real traffic scene and the movement state of the obstacle.

In some possible implementations, the real obstacle data can be modified according to an interface rule of the first traffic flow monitoring system to obtain the simulated obstacle data. Among them, the interface rule of the first traffic flow monitoring system refers to a condition that the obstacle data input into the first traffic flow monitoring system need to meet. In an implementation, the interface rule is used to indicate an interface parameter and an interface data format of the first traffic flow monitoring system.

The real obstacle data is modified according to the interface rule of the first traffic flow monitoring system, so that the simulated obstacle data obtained after the modifying meets the interface rule of the first traffic flow monitoring system, thereby making the first traffic flow monitoring system can identify and analyze the simulated obstacle data.

It should be noted that the manner in which the real obstacle data is modified according to the interface rule of the first traffic flow monitoring system is not limited in this embodiment, and possible implementations may be referred to the detailed description of the following embodiments.

S303: sending the simulated obstacle data to a first traffic flow monitoring system to be tested to test the first traffic flow monitoring system.

In this embodiment, after the test device constructs the simulated obstacle data, the simulated obstacle data is sent to the first traffic flow monitoring system to trigger the first traffic flow monitoring system to perform a perception analysis on the simulated obstacle data, thereby realizing the test of the first traffic flow monitoring system.

It should be understood that after the simulated obstacle data is sent to the first traffic flow monitoring system, multiple aspects of the first traffic flow monitoring system can be tested, including but not limited to: a link connectivity test, a performance stability test, an accuracy test of the monitoring result, etc., which is not limited in this embodiment.

The method for testing a traffic flow monitoring system provided in this embodiment includes: obtaining real obstacle data collected in a real traffic scene; generating simulated obstacle data according to the real obstacle data, where the simulated obstacle data is used to simulate an obstacle in the real traffic scene and a movement state of the obstacle; and sending the simulated obstacle data to a first traffic flow monitoring system to be tested to test the first traffic flow monitoring system. In the above process, since the simulated obstacle data is generated according to the real obstacle data collected in the real traffic scene, and the simulated obstacle data simulates the obstacle in the real traffic scene and the movement state of the obstacle, therefore, testing the first traffic flow monitoring system using the simulated obstacle data can ensure an authenticity of the obstacle and the movement state thereof input into the first traffic flow monitoring system, thereby ensuring the accuracy of the test result for the first traffic flow monitoring system.

On the basis of the foregoing embodiment, the following describes how to generate simulated obstacle data according to the real obstacle data in combination with a specific embodiment. This embodiment can be used as a refinement of S302 in the embodiment shown in FIG. 3.

Figure 4:
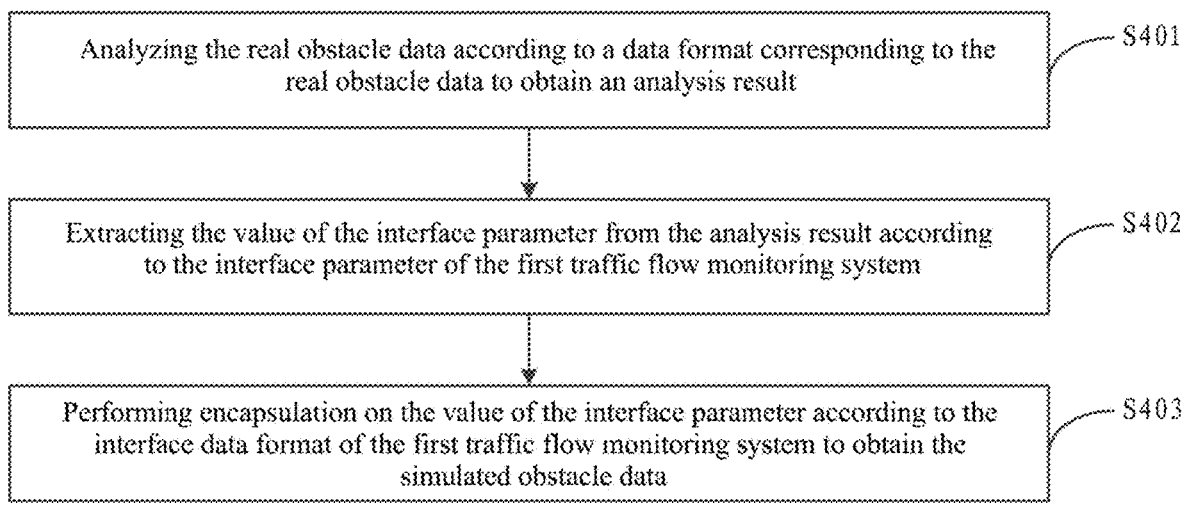
FIG. 4 is a schematic flowchart of generating simulated obstacle data based on real obstacle data according to an embodiment of the present application.

FIG. 4 is a schematic flowchart of generating simulated obstacle data based on real obstacle data according to an embodiment of the present application. As shown in FIG. 4, the method of this embodiment includes:

S401: analyzing the real obstacle data according to a data format corresponding to the real obstacle data to obtain an analysis result.

In some application scenes, the real obstacle data may be obtained from the second traffic flow monitoring system, and a data format adopted by the second traffic flow monitoring system may not satisfies the interface rule of the first traffic flow monitoring system. Therefore, it is necessary to analyze the real obstacle data according to the data format corresponding to the real obstacle data firstly to obtain the analysis result, and then modify the analysis result according to the interface rule of the first traffic flow monitoring system to obtain the simulated obstacle data.

Exemplarily, assuming that the data format of the real obstacle data is a protocol buffer (PB) data structure, the test device parses the real obstacle data according to the PB data structure to obtain the analysis result.

S402: extracting the value of the interface parameter from the analysis result according to the interface parameter of the first traffic flow monitoring system.

Among them, the interface parameter indicate a parameter required by the input of the first traffic flow monitoring system, including but not limited to a parameter used to describe the obstacle and the movement state thereof. Exemplarily, the interface parameter includes but is not limited to: an identification of the obstacle, a speed per hour, a heading angle, latitude and longitude coordinates, 3D viewing angle, a traffic event, and the like. The value of the above interface parameter can be extracted from the analysis result.

S403: performing encapsulation on the value of the interface parameter according to the interface data format of the first traffic flow monitoring system to obtain the simulated obstacle data.

Among them, the interface data format is used to indicate the data format that each interface parameter input into the first traffic flow monitoring system needs to meet. This embodiment does not limit the interface data format.

Exemplarily, assuming that the interface data format adopted by the first traffic flow monitoring system is a JavaScript object notation (JSON) data format, the value of the interface parameter extracted in S402 needs to be encapsulated into a JSON format.

When performing the format encapsulation, the value of the interface parameter can also be converted according to a preset conversion rule, for example, converting an unit of the speed per hour, converting a marking rule of the heading angle, and converting an coordinate system of the latitude and longitude coordinates, etc., thereby the value of the interface parameter is converted into a form that meets the requirements of the first traffic flow monitoring system.

In this embodiment, by modifying the real obstacle data according to an interface rule of the first traffic flow monitoring system to obtain the simulated obstacle data, on the one hand, making the simulated obstacle data satisfies the interface rule of the first traffic flow monitoring system, so that the first traffic flow monitoring system can identify and analyze the simulated obstacle data; on the other hand, the above modifying process retains the related information about the obstacle in the real obstacle data and the movement state thereof, so that the generated simulated obstacle data can simulate the obstacle in the real obstacle data and the movement state thereof.

Figure 5:
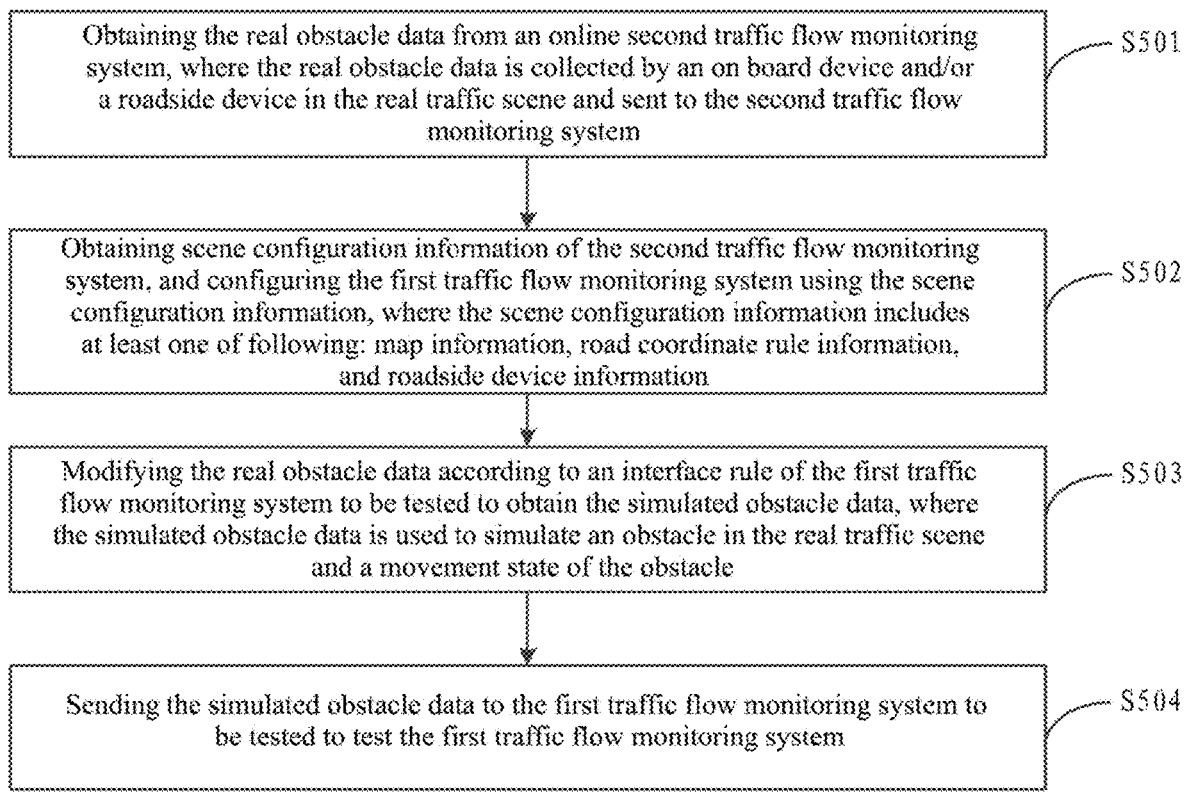
FIG. 5 is a schematic flowchart of another method for testing a traffic flow monitoring system provided by an embodiment of the present application.

FIG. 5 is a schematic flowchart of another method for testing a traffic flow monitoring system provided by an embodiment of the present application. This embodiment further details the embodiment shown in FIG. 3. As shown in FIG. 5, the method of this embodiment includes:

S501: obtaining the real obstacle data from an online second traffic flow monitoring system, where the real obstacle data is collected by an on board device and/or a roadside device in the real traffic scene and sent to the second traffic flow monitoring system.

In this embodiment, the second traffic flow monitoring system is an online system. In combination with the test scene shown in FIG. 2, the second traffic flow monitoring system is connected with an on board device and/or a roadside device. The on board device and/or the roadside device collects real obstacle data in the real traffic scene, and sends the real obstacle data to the second traffic flow monitoring system.

The test device establishes a communication connection with the second traffic flow monitoring system, and the test device may monitor the real obstacle data input to the second traffic flow monitoring system to obtain the real obstacle data. Exemplarily, the test device may use a websocket protocol to monitor the second traffic flow monitoring system. The websocket is a full-duplex communication protocol based on transmission control protocol (TCP). In this way, after the test device establishes a communication connection with the second traffic flow monitoring system, if the second traffic flow monitoring system receives real obstacle data from the on board device and/or the roadside device, it will push the real obstacle data to the test device. Thus, the test device obtains the real obstacle data.

In an implementation, the test device may set a time period for monitoring the second traffic flow monitoring system, for example, from 8 am to 8 pm every day. In this way, the test device can obtain the real obstacle data within the time period. By setting the monitoring time period, it is possible to test the first traffic flow monitoring system using the real obstacle data in different time periods according to the test requirement, thereby ensuring a sufficiency and a flexibility of the test.

In an implementation, after the test device monitors the real obstacle data from the second traffic flow monitoring system, it may store the real obstacle data in the database firstly. When the first traffic flow monitoring system needs to be tested, the real obstacle data is obtained from the database. In this way, the same real obstacle data can be used for multiple repeated tests to meet the needs of repeated tests, and in addition, the convenience of a test execution can be improved.

In an implementation, when the test device stores the real obstacle data in the database, it may further set tags for the real obstacle data, such as: a large flow scene, a medium flow scene, a low flow scene, a morning peak scene, an evening peak scene, a congested scene, an unblocked scenes, etc. These tags can indicate a traffic flow type corresponding to the real obstacle data. In this way, when the testing device needs to test the first traffic flow monitoring system, it can select the real obstacle data corresponding to the traffic flow type of the scene to be tested from the database according to the tags, so as to meet the needs of multiple test scenes, and to ensure the accuracy of the test results for different types of the scenes to be tested.

S502: obtaining scene configuration information of the second traffic flow monitoring system, and configuring the first traffic flow monitoring system using the scene configuration information, where the scene configuration information includes at least one of following: map information, road coordinate rule information, and roadside device information.

When the traffic flow monitoring system performs perceptual analysis on the obstacle, it needs to rely on the scene configuration information of the current scene. For example, the scene configuration information that needs to be relied on includes: map information corresponding to the current scene, road coordinate rule information of the current scene, location information of the roadside device in the current scene, and type information of the roadside device in the current scene. Therefore, in this embodiment, before testing the first traffic flow monitoring system using the real obstacle data obtained from the second traffic flow monitoring system, it is also necessary to synchronize the scene configuration information of the second traffic flow monitoring system to the first traffic flow monitoring system.

S503: modifying the real obstacle data according to an interface rule of the first traffic flow monitoring system to be tested to obtain the simulated obstacle data, where the simulated obstacle data is used to simulate an obstacle in the real traffic scene and a movement state of the obstacle.

It should be understood that the implementation of S503 can refer to the detailed description of the embodiment shown in FIG. 4, which is not repeated here.

S504: sending the simulated obstacle data to the first traffic flow monitoring system to be tested to test the first traffic flow monitoring system.

Specifically, a protocol encapsulation is performed on the simulated obstacle data generated in S503 according to the communication protocol adopted by the first traffic flow monitoring system. For example, if the first traffic flow monitoring system uses a Hypertext Transfer Protocol (HTTP), the HTTP protocol is used to encapsulate the simulated obstacle data. The encapsulated data is sent to the first traffic flow monitoring system.

In a possible implementation, S501 may include: obtaining a receiving frequency of the first traffic flow monitoring system, and obtaining the real obstacle data from the second traffic flow monitoring system according to the receiving frequency. Among them, the receiving frequency refers to an input frequency of the obstacle data required by the first traffic flow monitoring system. Correspondingly, S504 may include: sending the simulated obstacle data to the first traffic flow monitoring system to be tested according to the receiving frequency.

Exemplarily, assuming that the receiving frequency of the first traffic flow monitoring system is 7 hz, the monitoring frequency used for monitoring the second traffic flow monitoring system is 7 hz. In this way, the real obstacle data monitored from the second traffic flow monitoring system meets the receiving frequency of the first traffic flow monitoring system. Therefore, after the test device modifies the real obstacle data to obtain the simulated obstacle data, there is no need to perform frequency adaptation on the simulated obstacle data, which can be directly input to the first traffic flow monitoring system according to the received frequency, thereby increasing the test convenience and improving the test efficiency.

In this embodiment, the real obstacle data may include multiple pieces of obstacle data, and for each piece of the obstacle data, it is necessary to perform the modifying step in S503 and the sending step in S504. Due to the large amount of data for modifying the obstacle data, the execution of the modifying takes a long time. In addition, in S504, the modified simulated obstacle data needs to be sent to the first traffic flow monitoring system according to the receiving frequency. In order to ensure the receiving frequency of the first traffic flow monitoring system, the data modifying logic and the data sending logic can be processed separately in a multi-threaded manner in this embodiment. For example, a first thread may be used to execute the aforementioned S503, and a second thread may be used to execute the aforementioned S504. In this way, it is possible to ensure a timeliness of the data input into the first traffic flow monitoring system.

On the basis of the foregoing embodiments, after the simulated obstacle data is input into the first traffic flow monitoring system to be tested, multiple tests can be performed on the first traffic flow monitoring system, including but not limited to: a link connectivity test, a performance stability test, an accuracy test of the monitoring result, etc.

Figure 6:
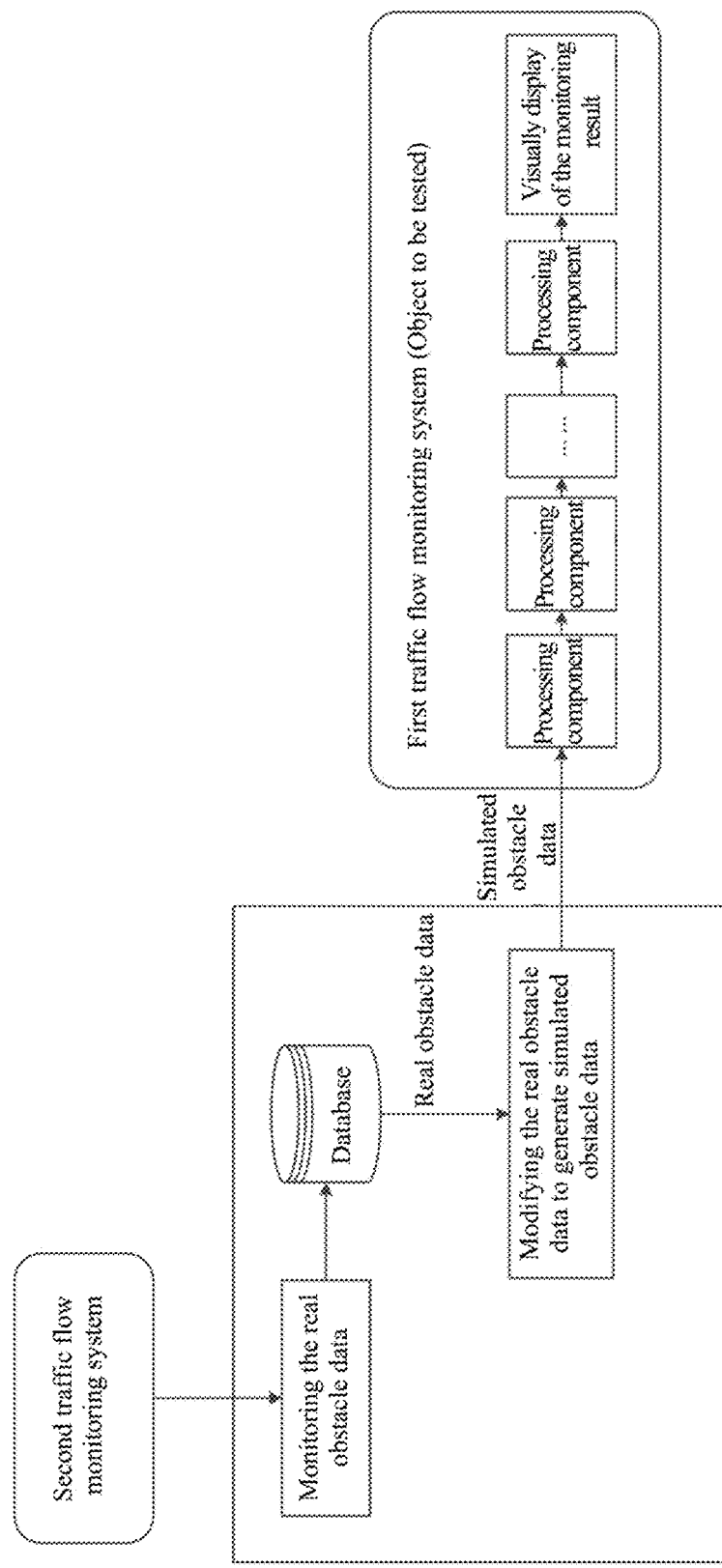
FIG. 6 is a schematic diagram of a testing process of a traffic flow monitoring system provided by an embodiment of the present application.

The following takes the link connectivity test as an example in combination with FIG. 6 for illustration.

FIG. 6 is a schematic diagram of a testing process of a traffic flow monitoring system provided by an embodiment of the present application. As shown in FIG. 6, the test device is in communication connection with the first traffic flow monitoring system, and the test device is in communication connection with the second traffic flow monitoring system. Multiple processing components are included in the first traffic flow monitoring system, such as: a platform bottom-level basic component, a persistent data processing component, distributed data storage component, and so on.

Referring to FIG. 6, the test device monitors the real obstacle data from the second traffic flow monitoring system, sets tags for the real obstacle data according to the current traffic flow type, and sorts and stores the real obstacle data in the database. Among them, the database may be located in the test device, or may be located in other devices other than the test device. It should be understood that the specific monitoring process is similar to the foregoing embodiment, and will not be repeated here.

Continue to refer to FIG. 6, when the test device needs to test the first traffic flow monitoring system, it obtains the real obstacle data with a label consistent with the traffic flow type of the scene to be tested according to the traffic flow type of the scene to be tested from the database. The test device modifies the real obstacle data and generates the simulated obstacle data. Among them, the modifying process of the obstacle data may refer to the detailed description of the foregoing embodiment, which will not be repeated here. The test device sends the generated simulated obstacle data to the first traffic flow monitoring system. The first traffic flow monitoring system uses the aforementioned multiple processing components to process the simulated obstacle data, and then outputs the monitoring result.

Further, the test device may also determine the test result for the link connectivity of the first traffic flow monitoring system according to whether the first traffic flow monitoring system outputs the monitoring result. Exemplarily, it is determined that a link connectivity between the multiple processing components in the first traffic flow monitoring system is normal if the first traffic flow monitoring system outputs a monitoring result; and it is determined that a link connectivity between the multiple processing components in the first traffic flow monitoring system is abnormal if the first traffic flow monitoring system does not output a monitoring result. In this way, the test for the link connectivity of the first traffic flow monitoring system is realized.

Figure 7:
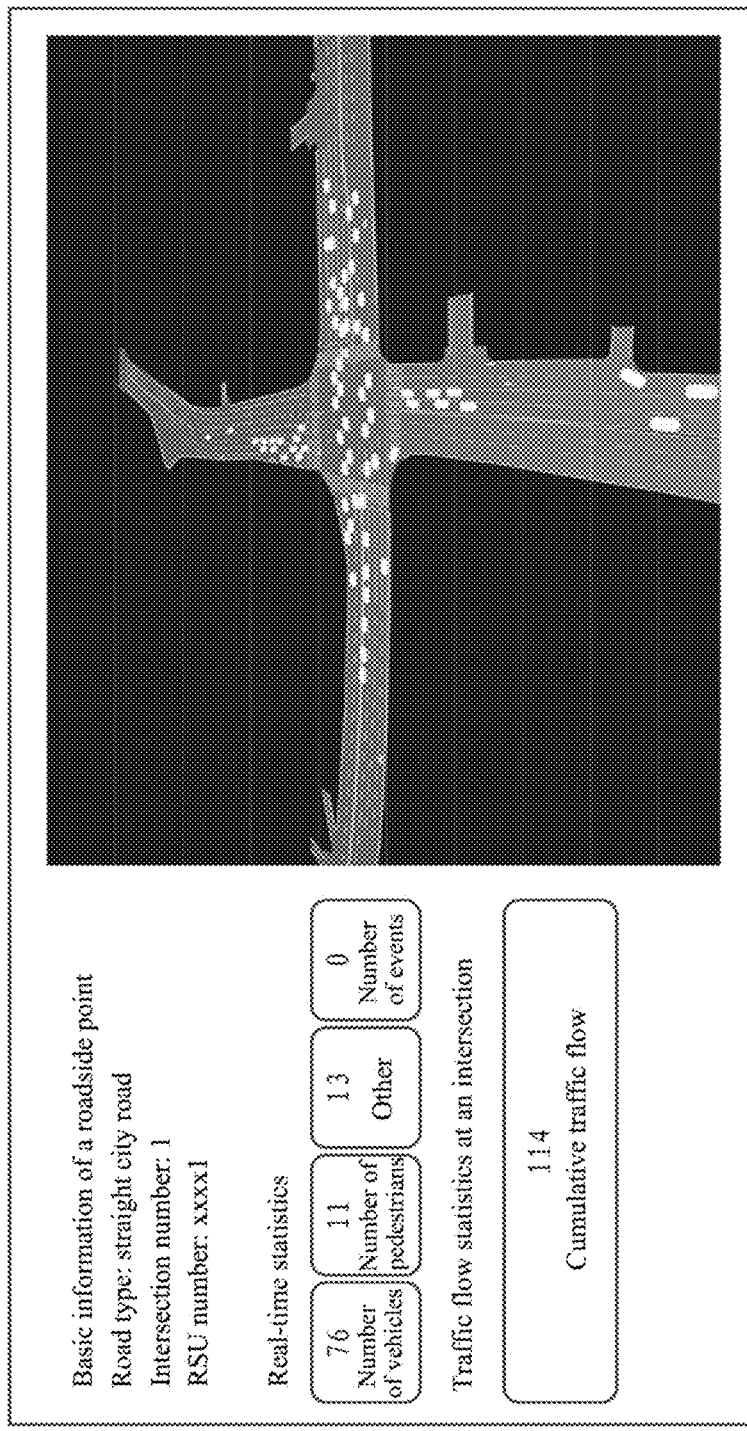
FIG. 7 is a schematic diagram of a traffic flow visualization display interface provided by an embodiment of the present application.

In some possible implementations, continue to refer to FIG. 6, the monitoring result can also be visually displayed by the first traffic flow monitoring system. Exemplarily, FIG. 7 is a schematic diagram of a traffic flow visualization display interface provided by an embodiment of the present application. As shown in FIG. 7, in the display interface, the monitoring results of the first traffic flow monitoring system may be visually displayed in real time (as shown in the right area in FIG. 7). In this display interface, real-time data statistics and cumulative data statistics may also be displayed (as shown in the left area in FIG. 7). It should be noted that the display interface shown in FIG. 7 is only a possible example, and the embodiment of the present application does not limit the display form and the display content of the visualization interface. In this embodiment, it is possible to determine whether the first traffic flow monitoring system displays the visual monitoring results as shown in FIG. 7, if yes, it is determined that the link connectivity of the first traffic flow monitoring system is normal, if no, it is determined that the link connectivity of the first traffic flow monitoring system is abnormal.

Figure 8A:
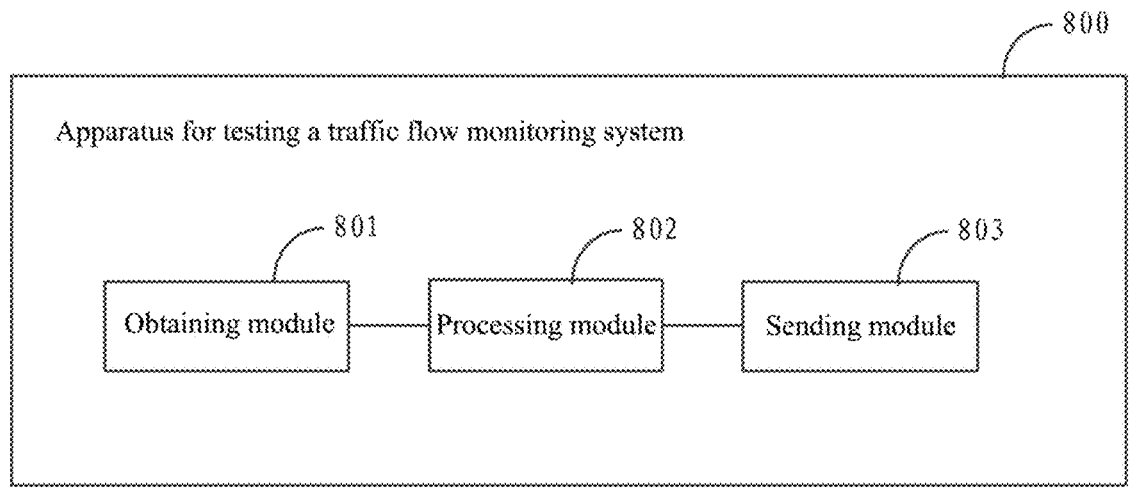
FIG. 8A is a schematic structural diagram of an apparatus for testing a traffic flow monitoring system provided by an embodiment of the present application.

FIG. 8A is a schematic structural diagram of an apparatus for testing a traffic flow monitoring system provided by an embodiment of the present application. The apparatus in this embodiment may be in a form of software and/or hardware, and the apparatus may be used as a test device or integrated into the test device. As shown in FIG. 8A, the apparatus for testing a traffic flow monitoring system 800 provided in this embodiment includes an obtaining module 801, a processing module 802, and a sending module 803.

Among them, the obtaining module 801 is configured to obtain real obstacle data collected in a real traffic scene;

the processing module 802 is configured to generate simulated obstacle data according to the real obstacle data, where the simulated obstacle data is used to simulate an obstacle in the real traffic scene and a movement state of the obstacle; and the sending module 803 is configured to send the simulated obstacle data to a first traffic flow monitoring system to be tested to test the first traffic flow monitoring system.

The apparatus provided in this embodiment may be used to implement the technical solution in the method embodiment shown in FIG. 3, and their implementation principles and technical effects are similar, and will not be repeated here.

Figure 8B:
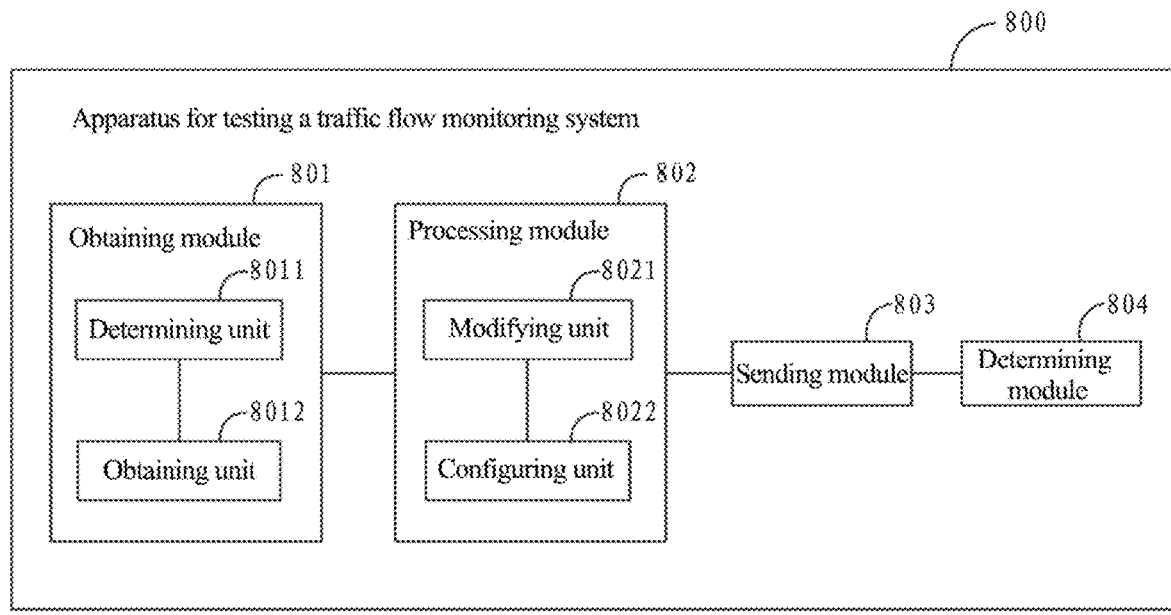
FIG. 8B is a schematic structural diagram of another apparatus for testing a traffic flow monitoring system provided by an embodiment of the present application.

FIG. 8B is a schematic structural diagram of another apparatus for testing a traffic flow monitoring system provided by an embodiment of the present application, This embodiment refines the apparatus of the embodiment shown in FIG. 8A.

In a possible implementation, as shown in FIG. 8B, the processing module 802 includes a modifying unit 8021; where the modifying unit 8021 is configured to modify the real obstacle data according to an interface rule of the first traffic flow monitoring system to obtain the simulated obstacle data.

In a possible implementation, the interface rule is used to indicate an interface parameter and an interface data format of the first traffic flow monitoring system; the modifying unit 8021 is specifically configured to: extract a value of the interface parameter from the real obstacle data according to the interface parameter of the first traffic flow monitoring system; and perform encapsulation on the value of the interface parameter according to the interface data format of the first traffic flow monitoring system to obtain the simulated obstacle data.

In a possible implementation, the modifying unit 8021 is specifically configured to:

analyze the real obstacle data according to a data format corresponding to the real obstacle data to obtain an analysis result; and extract the value of the interface parameter from the analysis result according to the interface parameter of the first traffic flow monitoring system.

In a possible implementation, the obtaining module 801 is specifically configured to obtain the real obstacle data from an online second traffic flow monitoring system, where the real obstacle data is collected by an on board device and/or a roadside device in the real traffic scene and sent to the second traffic flow monitoring system.

In a possible implementation, the obtaining module 801 is specifically configured to obtain a receiving frequency of the first traffic flow monitoring system, and obtain the real obstacle data from the second traffic flow monitoring system according to the receiving frequency; and the sending module 803 is specifically configured to send the simulated obstacle data to the first traffic flow monitoring system to be tested according to the receiving frequency.

In a possible implementation, the processing module 802 further includes: a configuring unit 8022;

the configuring unit 8022 is configured to obtain scene configuration information of the second traffic flow monitoring system, and configure the first traffic flow monitoring system using the scene configuration information; where the scene configuration information includes at least one of following: map information, road coordinate rule information, and roadside device information.

In a possible implementation, the obtaining module 801 includes a determining unit 8011 and an obtaining unit 8012;

the determining unit 8011 is configured to determine a traffic flow type of a scene to be tested corresponding to the first traffic flow monitoring system; and the obtaining unit 8012 is configured to obtain real obstacle data collected in a first real traffic scene, where a traffic flow type of the first real traffic scene is consistent with the traffic flow type of the scene to be tested.

In a possible implementation, the first traffic flow monitoring system includes multiple processing components; and the apparatus further includes a determining module 804, which is configured to:

determine that a link connectivity between the multiple processing components in the first traffic flow monitoring system is normal in a case that the first traffic flow monitoring system outputs a monitoring result;

determine that a link connectivity between the multiple processing components in the first traffic flow monitoring system is abnormal in a case that the first traffic flow monitoring system does not output a monitoring result.

The apparatus of this embodiment can be used to execute the technical solutions in any of the foregoing method embodiments, and their implementation principles and technical effects are similar, and will not be repeated here.

According to the embodiments of the present application, the present application also provides an electronic device and a readable storage medium. The electronic device can be used as a test device.

Figure 9:
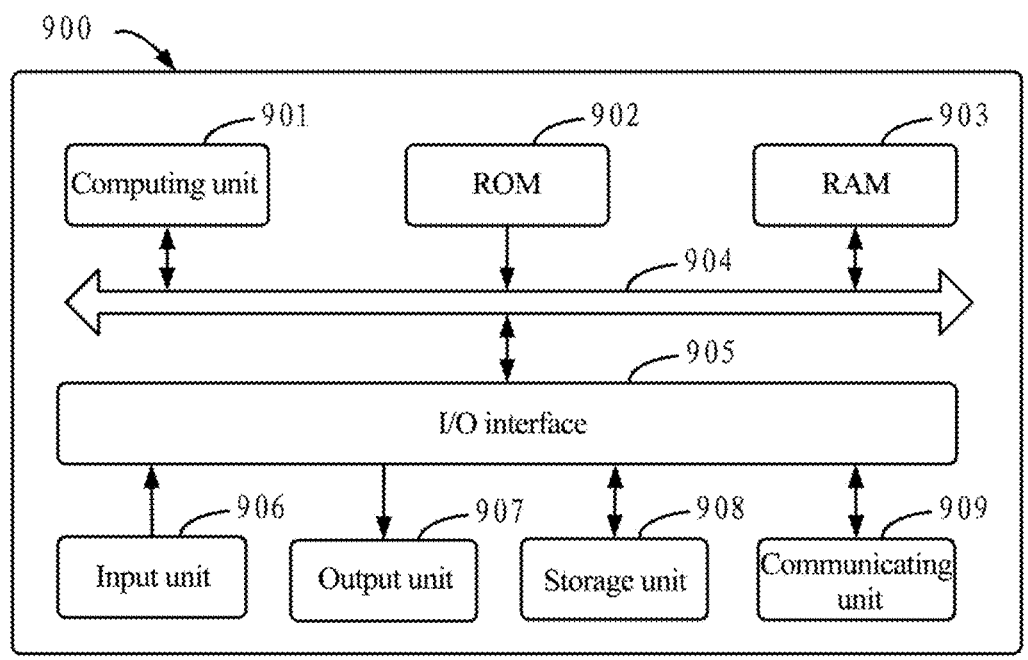
FIG. 9 is a schematic structural diagram of an electronic device provided by an embodiment of the present application.

According to an embodiment of the present application, the present application also provides a computer program product, where the computer program product includes: a computer program, and a computer program is stored in a readable storage medium, at least one processor of the electronic device can read the computer program from the readable storage medium, and at least one processor executes the computer program to make the electronic device execute the solution provided by any of the above embodiments FIG. 9 shows a schematic block diagram of an example electronic device 900 which can be used to implement embodiments of the present application. The electronic device is intended to represent various forms of digital computers, such as a laptop computer, a desktop computer, a workbench, a personal digital assistant, a server, a blade server, a mainframe computer, and other suitable computers. The electronic device can also represent various forms of mobile apparatus, such as a personal digital assistant, a cellular phone, a smart phone, a wearable device, and other similar computing apparatus. The components, their connections and relationships, and their functions herein are merely examples, and are not intended to limit an implementation of the present application described and/or claimed herein.

As shown in FIG. 9, the electronic device 900 includes a computing unit 901, which may perform various appropriate actions and processes according to a computer program stored in a read-only memory (ROM) 902 or a computer program loaded from a storage unit 908 into a random access memory (RAM) 903. In the RAM 903, various programs and data required for the operation of the electronic device 900 may also be stored. The computing unit 901, the ROM 902, and the RAM 903 are connected to each other through a bus 904. An input/output (I/O) interface 905 is also connected to the bus 904.

Multiple components in the device 900 are connected to the I/O interface 905, including: an inputting unit 906, such as a keyboard, a mouse, etc.; an outputting unit 907, such as various types of displays, speakers, etc.; and a storage unit 908, such as a magnetic disk, an optical disk, etc.; and a communicating unit 909, such as an network card, a modem, a wireless communication transceiver, etc. The communicating unit 909 allows the device 900 to exchange information/data with other devices through a computer network such as the Internet and/or various telecommunication networks.

The computing unit 901 may be various general and/or special-purpose processing components with processing and computing capabilities. Some examples of the computing unit 901 include, but are not limited to, a central processing unit (CPU), a graphics processing unit (GPU), various dedicated artificial intelligence (AI) computing chips, various computing units that run machine learning model algorithms, and digital signal processing (DSP), as well as any appropriate processor, a controller, a microcontroller, etc. The computing unit 901 executes the various methods and processes described above, such as the method for testing a traffic flow monitoring system. For example, in some embodiments, the method for testing a traffic flow monitoring system be implemented as a computer software program, which is tangibly contained in a machine-readable medium, such as the storage unit 908. In some embodiments, part or all of the computer program may be loaded and/or installed on the device 900 via the ROM 902 and/or the communicating unit 909. When the computer program is loaded into the RAM 903 and executed by the computing unit 901, one or more steps of the method for testing a traffic flow monitoring system described above may be executed. Alternatively, in other embodiments, the computing unit 901 may be configured to execute the method for testing a traffic flow monitoring system through any other suitable means (for example, by a firmware).

The various implementations of the systems and technologies described above in this article can be implemented in a digital electronic circuit system, an integrated circuit system, a field programmable gate array (FPGA), an application-specific integrated circuit (ASIC), an application-specific standard product (ASSP), a system on chip system (SOC), a complex programming logic device (CPLD), a computer hardware, a firmware, a software, and/or a combination thereof. These various embodiments may include: being implemented in one or more computer programs, the one or more computer programs may be executed and/or interpreted on a programmable system including at least one programmable processor, the programmable processor may be a dedicated or general-purpose programmable processor that can receive data and instructions from a storage system, at least one input device, and at least one output device, and transmit data and instructions to the storage system, the at least one input device, and the at least one output device.

The program code used to implement the method of the present application can be written in any combination of one or more programming languages. The program code can be provided to a processor or a controller of a general-purpose computer, a special-purpose computer, or other programmable data processing apparatus, so that when the program code is executed by the processor or the controller, functions specified in the flowcharts and/or block diagrams are implemented. The program code may be executed entirely on a machine, partly executed on the machine, partly executed on the machine and partly executed on a remote machine as an independent software package, or entirely executed on a remote machine or a server.

In the context of the present application, a machine-readable medium may be a tangible medium, which may contain or store a program for use by an instruction execution system, apparatus, or device or in combination with an instruction execution system, apparatus, or device. The machine-readable medium may be a machine-readable signal medium or a machine-readable storage medium. The machine-readable medium may include, but is not limited to, an electronic, magnetic, optical, electromagnetic, infrared, or a semiconductor system, apparatus, or device, or any suitable combination of the foregoing. More specific examples of the machine-readable storage media would include electrical connections based on one or more wires, a portable computer disk, a hard disk, a random access memory (RAM), a read-only memory (ROM), a erasable programmable read-only memory (EPROM or flash memory), an optical fiber, a portable compact disk read-only memory (CD-ROM), an optical storage device, a magnetic storage device, or any suitable combination of the foregoing.

In order to provide interaction with users, the systems and techniques described herein may be implemented on a computer, where the computer has: a display apparatus (for example, a CRT (cathode ray tube) or an LCD (liquid crystal display) monitor) for displaying information to users; and a keyboard and a pointing apparatus (for example, a mouse or a trackball) though which users may provide input to the computer. Other types of apparatus may also be used to provide interaction with users; for example, the feedback provided to users may be any form of sensing feedback (for example, visual feedback, audible feedback, or tactile feedback); and the input from users may be received in any form (including sound input, voice input, or tactile input).

The systems and techniques described herein may be implemented in a computing system that includes a back end component (for example, a data server), or a computing system that includes a middleware component (for example, an application server), or a computing system that includes a front end component (for example, a user computer with a graphical user interface or a web browser, through which the user can interact with the implementations of the systems and techniques described herein), or a computing system that includes any combination of such back end component, middleware component, or front end component. System components may be connected to each other by any form or medium of digital data communication (for example, a communication network). Examples of the communication network include: a local area network (LAN), a wide area network (WAN) and Internet.

A computer system may include a client and a server. The client and the server are generally far from each other and usually perform interactions through a communication network. A relationship between the client and the server is generated by a computer program running on corresponding computers and having a client-server relationship. The server may be a cloud server, also known as a cloud computing server or a cloud host, which is a host product in the cloud computing service system to solve the disadvantages of difficult management and weak business scalability in a traditional physical host and Virtual Private Server (VPS for short) service. The server may also be a server of a distributed system, or a server combined with a blockchain.

It should be understood that various forms of processes shown above can be used, and steps may be reordered, added, or deleted. For example, the steps described in the present application may be performed in parallel or sequentially or in different orders. As long as desired results of the technical solutions disclosed in the present application can be achieved, no limitation is made herein.

The above specific embodiments do not constitute a limitation to the protection scope of the present application. Persons skilled in the art should know that various modifications, combinations, sub-combinations and substitutions can be made according to design requirements and other factors. Any modification, equivalent replacement and improvement made within the spirit and principle of the present application shall be included in the protection scope of the present application.

What is claimed is:

1. A method for testing a traffic flow monitoring system, comprising:
    obtaining real obstacle data collected in a real traffic scene;
    generating simulated obstacle data according to the real obstacle data, wherein the simulated obstacle data is used to simulate an obstacle in the real traffic scene and a movement state of the obstacle; and
    sending the simulated obstacle data to a first traffic flow monitoring system to be tested to test the first traffic flow monitoring system;
    wherein the generating the simulated obstacle data according to the real obstacle data comprises:
    modifying the real obstacle data according to an interface rule of the first traffic flow monitoring system to obtain the simulated obstacle data;
    wherein the interface rule is used to indicate an interface parameter and an interface data format of the first traffic flow monitoring system; the modifying the real obstacle data according to the interface rule of the first traffic flow monitoring system to obtain the simulated obstacle data comprises:
    extracting a value of the interface parameter from the real obstacle data according to the interface parameter of the first traffic flow monitoring system; and
    performing encapsulation on the value of the interface parameter according to the interface data format of the first traffic flow monitoring system to obtain the simulated obstacle data.

2. The method according to claim 1, wherein the extracting the value of the interface parameter from the real obstacle data according to the interface parameter of the first traffic flow monitoring system comprises:
    analyzing the real obstacle data according to a data format corresponding to the real obstacle data to obtain an analysis result; and
    extracting the value of the interface parameter from the analysis result according to the interface parameter of the first traffic flow monitoring system.

3. The method according to claim 1, wherein the obtaining the real obstacle data collected in the real traffic scene comprises:
    obtaining the real obstacle data from an online second traffic flow monitoring system, wherein the real obstacle data is collected by an on board device and/or a roadside device in the real traffic scene and sent to the second traffic flow monitoring system.

4. The method according to claim 3, wherein the obtaining the real obstacle data from the online second traffic flow monitoring system comprises:
    obtaining a receiving frequency of the first traffic flow monitoring system, and obtaining the real obstacle data from the second traffic flow monitoring system according to the receiving frequency; and
    the sending the simulated obstacle data to the first traffic flow monitoring system to be tested comprises:
    sending the simulated obstacle data to the first traffic flow monitoring system to be tested according to the receiving frequency.

5. The method according to claim 3, wherein before the sending the simulated obstacle data to the first traffic flow monitoring system to be tested, further comprising:
    obtaining scene configuration information of the second traffic flow monitoring system, and configuring the first traffic flow monitoring system using the scene configuration information;
    wherein the scene configuration information comprises at least one of following: map information, road coordinate rule information, and roadside device information.

6. The method according claim 1, wherein the obtaining the real obstacle data collected in the real traffic scene comprises:
    determining a traffic flow type of a scene to be tested corresponding to the first traffic flow monitoring system; and
    obtaining real obstacle data collected in a first real traffic scene, wherein a traffic flow type of the first real traffic scene is consistent with the traffic flow type of the scene to be tested.

7. The method according claim 1, wherein the first traffic flow monitoring system comprises multiple processing components; after the sending the simulated obstacle data to the first traffic flow monitoring system to be tested, further comprising:
    determining that a link connectivity between the multiple processing components in the first traffic flow monitoring system is normal in a case that the first traffic flow monitoring system outputs a monitoring result; and
    determining that a link connectivity between the multiple processing components in the first traffic flow monitoring system is abnormal in a case that the first traffic flow monitoring system does not output a monitoring result.

8. An electronic device, comprising:
    at least one processor; and
    a memory communicatively connected to the at least one processor;
    wherein the memory is stored with instructions executable by the at least one processor, and the instructions are executed by the at least one processor to enable the at least one processor to:
    obtain real obstacle data collected in a real traffic scene;
    generate simulated obstacle data according to the real obstacle data, wherein the simulated obstacle data is used to simulate an obstacle in the real traffic scene and a movement state of the obstacle; and
    send the simulated obstacle data to a first traffic flow monitoring system to be tested to test the first traffic flow monitoring system;
    wherein the at least one processor is further configured to:
    modify the real obstacle data according to an interface rule of the first traffic flow monitoring system to obtain the simulated obstacle data;

wherein the interface rule is used to indicate an interface parameter and an interface data format of the first traffic flow monitoring system; the at least one processor is further configured to:
- extract a value of the interface parameter from the real obstacle data according to the interface parameter of the first traffic flow monitoring system; and
- perform encapsulation on the value of the interface parameter according to the interface data format of the first traffic flow monitoring system to obtain the simulated obstacle data.

9. The electronic device according to claim 8, wherein the at least one processor is further configured to:
- analyze the real obstacle data according to a data format corresponding to the real obstacle data to obtain an analysis result; and
- extract the value of the interface parameter from the analysis result according to the interface parameter of the first traffic flow monitoring system.

10. The electronic device according to claim 8, wherein the at least one processor is further configured to:
- obtain the real obstacle data from an online second traffic flow monitoring system, wherein the real obstacle data is collected by an on board device and/or a roadside device in the real traffic scene and sent to the second traffic flow monitoring system.

11. The electronic device according to claim 10, wherein the at least one processor is further configured to obtain a receiving frequency of the first traffic flow monitoring system, and obtain the real obstacle data from the second traffic flow monitoring system according to the receiving frequency; and
- send the simulated obstacle data to the first traffic flow monitoring system to be tested according to the receiving frequency.

12. The electronic device according to claim 10, wherein the at least one processor is further configured to:
- obtain scene configuration information of the second traffic flow monitoring system, and configure the first traffic flow monitoring system using the scene configuration information;
- wherein the scene configuration information comprises at least one of following: map information, road coordinate rule information, and roadside device information.

13. The electronic device according to claim 8, wherein the at least one processor is further configured to:
- determine a traffic flow type of a scene to be tested corresponding to the first traffic flow monitoring system; and
- obtain real obstacle data collected in a first real traffic scene, wherein a traffic flow type of the first real traffic scene is consistent with the traffic flow type of the scene to be tested.

14. The electronic device according to claim 8, wherein the first traffic flow monitoring system comprises multiple processing components; and the at least one processor is further configured to:
- determine that a link connectivity between the multiple processing components in the first traffic flow monitoring system is normal in a case that the first traffic flow monitoring system outputs a monitoring result; and
- determine that a link connectivity between the multiple processing components in the first traffic flow monitoring system is abnormal in a case that the first traffic flow monitoring system does not output a monitoring result.

15. A non-transitory computer readable storage medium stored with computer instructions, wherein the computer instructions are configured to enable a computer to:
- obtain real obstacle data collected in a real traffic scene;
- generate simulated obstacle data according to the real obstacle data, wherein the simulated obstacle data is used to simulate an obstacle in the real traffic scene and a movement state of the obstacle; and
- send the simulated obstacle data to a first traffic flow monitoring system to be tested to test the first traffic flow monitoring system;
- wherein the computer instructions are further configured to enable the computer to:
- modify the real obstacle data according to an interface rule of the first traffic flow monitoring system to obtain the simulated obstacle data;
- wherein the interface rule is used to indicate an interface parameter and an interface data format of the first traffic flow monitoring system; the computer instructions are further configured to enable the computer to:
- extract a value of the interface parameter from the real obstacle data according to the interface parameter of the first traffic flow monitoring system; and
- perform encapsulation on the value of the interface parameter according to the interface data format of the first traffic flow monitoring system to obtain the simulated obstacle data.

* * * * *